(12) United States Patent
Martin

(10) Patent No.: US 6,936,773 B2
(45) Date of Patent: Aug. 30, 2005

(54) BOARD IMPEDANCE MANAGEMENT

(75) Inventor: Ronald Martin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 313 days.

(21) Appl. No.: 10/268,876

(22) Filed: Oct. 10, 2002

(65) Prior Publication Data
US 2004/0070957 A1 Apr. 15, 2004

(51) Int. Cl.[7] .................................................. H05K 1/16
(52) U.S. Cl. .......................... 174/255; 174/261; 333/33
(58) Field of Search ................................ 257/691, 698, 257/700; 174/255; 361/780, 794–796, 788; 333/33

(56) References Cited

U.S. PATENT DOCUMENTS

| | | | |
|---|---|---|---|
| 6,219,255 B1 * | 4/2001 | Teshome | 361/794 |
| 6,700,457 B2 * | 3/2004 | McCall et al. | 333/33 |
| 6,782,243 B2 * | 8/2004 | Shiotsu et al. | 455/117 |
| 6,822,876 B2 * | 11/2004 | Goergen | 361/788 |
| 2004/0228100 A1 * | 11/2004 | Wright | 361/794 |

* cited by examiner

Primary Examiner—Kamand Cuneo
Assistant Examiner—Yuriy Semenenko
(74) Attorney, Agent, or Firm—Carrie A. Boone, P.C.

(57) ABSTRACT

A system and method are disclosed in which separate impedance compensation circuitry is allocated for an interface according to the space occupied on a printed circuit board (PCB) by the interface. Where an interface occupies two or more layers of the PCB, an impedance compensation circuit is dedicated to each layer on behalf of the interface. By dedicating impedance compensation, not just to the interface alone, but to the physical space occupied by the interface, the system and method are able to exploit multiple-layer and same-layer trace impedances, save board space and/or provide AC timings recovery.

26 Claims, 3 Drawing Sheets

BOARD IMPEDANCE MANAGEMENT

FIELD OF THE INVENTION

This invention relates to printed circuit boards and, more particularly, impedance issues involving printed circuit boards.

BACKGROUND OF THE INVENTION

Printed circuit boards, known commonly as PCBs, are ubiquitous in the electronics industry. In addition to connecting integrated circuits (ICs) and other components, the PCB also is a mechanical mounting surface for the devices. A multi-layered PCB typically includes at least one signal layer and reference potential layers, also known as ground and power.

The PCB consists of a laminate of a conductive material, usually copper, as well as an insulating dielectric substrate. The traces formed of the copper material provide signaling paths for communication between the ICs, discrete components, or other circuitry mounted on the PCB. Under certain operating conditions, the traces act like transmission lines. In particular, board designs involving high-speed signals pay close attention to the impedance of these communication paths.

Impedance is a measure of passive opposition to the flow of current along the trace. Impedance consists of resistance (to direct current), reactance (to alternating current), inductance and capacitance. The length and width of each trace, its proximity to other traces, and the number of board layers are among the many factors affecting trace impedance. Generally, wider traces have lower impedances, where other factors are equal.

An impedance mismatch is the discontinuity between the impedances of two communicating components. When an impedance mismatch is present, reflection along the signal trace can occur. The reflected signal will add to or subtract from the original signal being transmitted between the components, causing a distortion and, possibly, a failure of the transmission.

Generally, PCB boards are manufactured to meet certain trace impedances, within some tolerance. Thus, where a 50-ohm PCB is specified, plus or minus fifteen percent, the impedance of all traces on the PCB will be between 42.5 and 57.5 ohms. A single PCB can simultaneously include traces of different widths, such as 50-ohm traces and 60-ohm traces, for example. This enables signal groups with different impedance requirements to simultaneously occupy the PCB. A memory interface may have a 60-ohm impedance requirement while a processor interface, located on the same PCB, has a 50-ohm impedance requirement.

Despite having a board with a known trace impedance, board designers ensure that the impedance between devices matches whenever possible. Impedance matching improves signal integrity by reducing reflections and ringing along the trace that may adversely affect system performance.

Most traces on the PCB are terminated, such as by adding resistors or buffers to the output and/or the input of an integrated circuit. The output impedance or input termination of the circuit is matched to the characteristic impedance of the connecting trace. This impedance matching is a consideration for most system designs.

Many system designs include impedance compensation circuitry, such as resistive compensation or controlled impedance drivers. Impedance compensation circuitry may be dedicated to separate signal groups of a system design. Thus, a memory controller may have its own impedance compensation circuitry, likewise for the processor, the I/O controller, and so on. A single PCB may thus maintain several impedance compensation circuits for various interfaces.

Studies have shown that the variation of trace impedance between two locations on the same layer of the PCB is lower than when the two locations are on different layers of the PCB. In particular, same layer variation in the trace impedance on some PCBs may be about five percent. The trace impedance variation between a first location on a first layer and a second location on a second layer (microstrip) is approximately seven to ten percent.

While impedance compensation circuitry facilitates impedance matching, it fails to consider the differences in trace impedances between same-layer and different-layer traces. Thus, there is a need to develop impedance compensation circuitry that accounts for the known variations in trace impedances.

DETAILED DESCRIPTION

According to the embodiments described herein, a system and method are disclosed in which separate impedance compensation circuitry is allocated for an interface according to the space occupied on a printed circuit board (PCB) by the interface. Where an interface occupies two or more layers of the PCB, an impedance compensation circuit is dedicated to each layer on behalf of the interface. By dedicating impedance compensation, not just to the interface alone, but to the physical space occupied by the interface, the system and method are able to exploit same layer trace impedances, save board space and/or provide AC timings recovery.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. For simplicity, a four-layer printed circuit board is used in the described embodiments. However a system employing any multilayer PCB can utilize the principles of the claimed invention. Further, although a small number of system interfaces are described, any interface employing impedance compensation can utilize the principles of the claimed invention. The following detailed description is, therefore, not to be construed in a limiting sense, as the scope of the present invention is defined by the claims.

Figure 1:
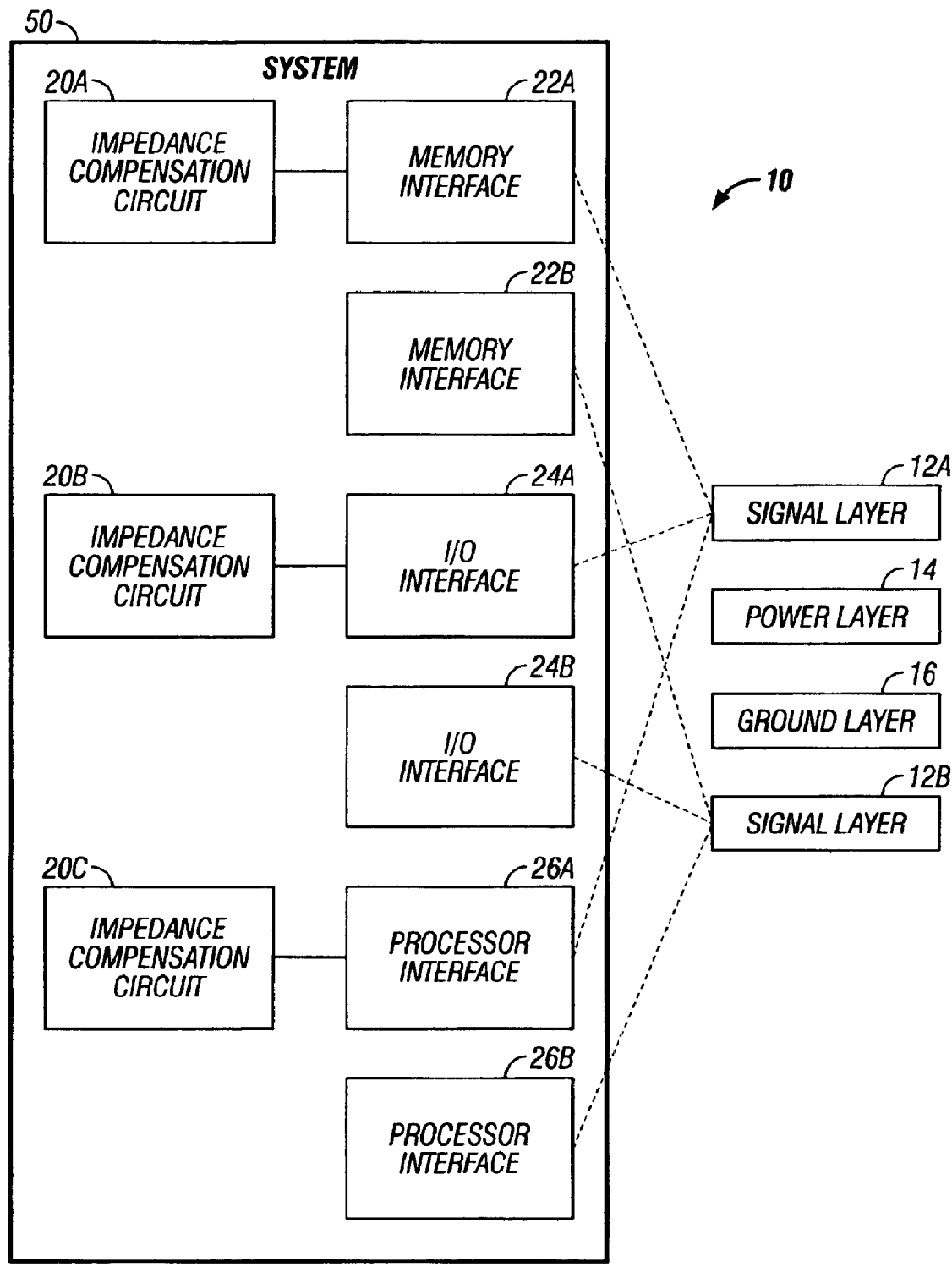
FIG. 1 is a block diagram of a system employing impedance compensation according to the prior art.

In FIG. 1, according to the prior art, a system 50 includes memory interfaces 22A and 22B (collectively, memory interface 22), input/output (I/O interfaces 24A and 24B (collectively, i/o interface 24), and processor interfaces 26A and 26B (collectively, processor interface 26), These interfaces may be a part of a processor-based system, such as a computer, a personal digital assistant (PDA), a cellular telephone, or other electronic device. The system 50 may include other interfaces not shown.

Also depicted in FIG. 1, impedance compensation circuits 20A, 20B, and 20C (collectively, impedance compensation circuits 20), are connected to the memory interface 22, the I/O interface 24, and the processor interface 26, respectively. A separate impedance composition circuit 20 is thus allocated for each interface in the system 50. Each impedance compensation circuit 20 ensures that the impedance of tis associated interface matches, as closely as possible, the impedance of signal traces coupled to the interface.

The various interfaces of the system 50 are distributed upon one or more layers of a PCB 10. In FIG. 1, the PCB 10 is a four-layer board, comprising two signal layers 12A and 12B (collectively, signal layers 12), a power layer 14, and a ground layer 16. For simplicity, a four-layer PCB is depicted, but the system 50 can occupy any multi-layered PCBs comprising at least two signal layers.

Each interface comprises two portions, one to occupy each signal layer of the PCB 10. Dotted lines denote the physical location of each portion. Memory interface 22A occupies signal layer 12A and memory interface 22B occupies signal layer 12B. Likewise, I/O interface 24A occupies signal layer 12A and I/O interface 24B occupies signal layer 12B.

PCBs are manufactured according to certain specifications, including the impedance of the traces on the PCB. One or more trace impedances are specified to the PCB manufacturers, who then deliver the boards that meet the specified impedances within a range. Some personal computer motherboards are designed with 50- and 60-ohm traces, as one example. Multiple trace impedances allow interfaces with distinct impedance requirements to occupy the same PCB. Thus, for example, in the system 50 of FIG. 1, the 50-ohm traces may be used by the processor interface 26 while the 60-ohm traces are used by the memory interface 22.

Further, these trace impedances are designed to be within a certain range, known as its tolerance. Personal computer motherboards, for example, typically have a tolerance of +/–15%. The design of the system is expected to account for the tolerance. Thus, for example, the memory interface 22 is designed to expect trace impedances to be anywhere from 51 to 69 ohms.

However, as the dotted lines in FIG. 1 illustrate, each interface of the system 50 may physically occupy more than one signal layer of the PCB 10. The impedance compensation circuit 20A measures the trace impedance at a single trace located on the signal layer 12A, then calibrates the I/O buffers for the memory interface 22A (on the signal layer 12A) and for the memory interface 22B (on the signal layer 12B).

Figure 2:
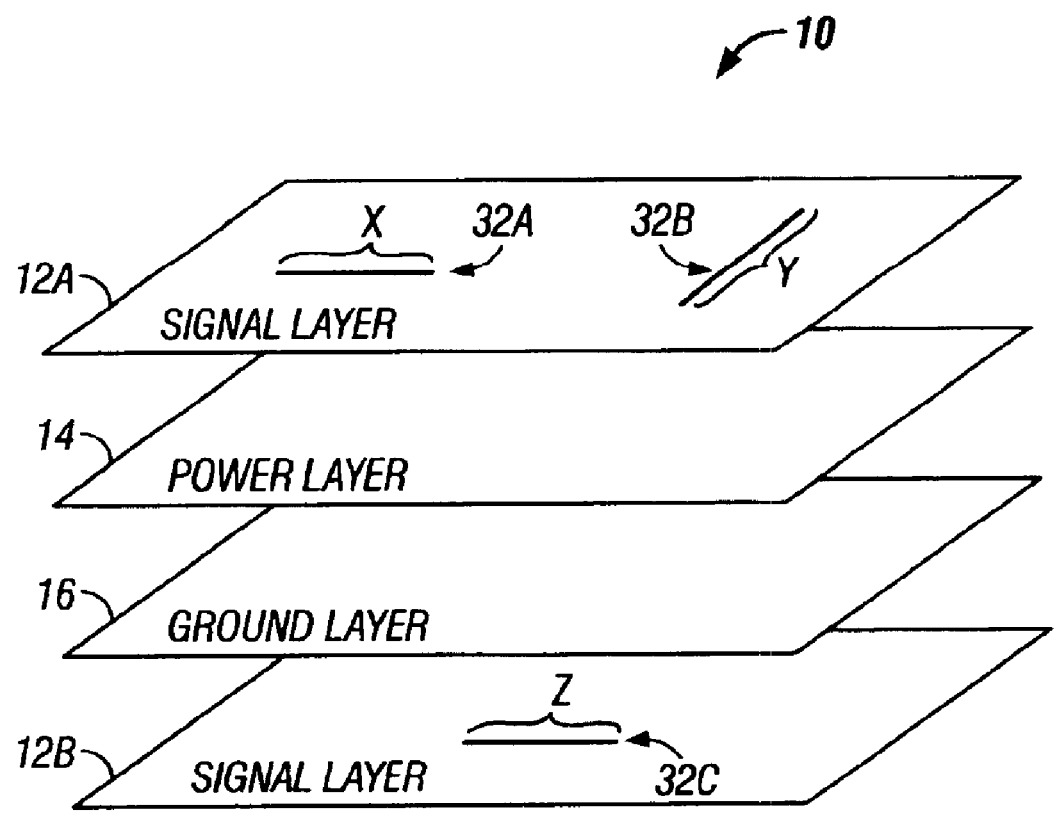
FIG. 2 is a schematic diagram of a four-layer printed circuit board according to the prior art.

This phenomenon is illustrated in the schematic diagram of the PCB 10 in FIG. 2. The PCB 10 includes signal layers 12A and 12B, as well as power layer 14 and ground layer 16. Signal traces 32A, 32B, and 32C (collectively, signal traces 32) are featured, in which signal traces 32A and 32B are on signal layer 12A while signal trace 32C is on signal layer 12B. Each signal trace 32 has an associated trace impedance of some value, expressed in ohms. Thus, signal trace 32A has a trace impedance X, signal trace 32B has a trace impedance Y, and signal trace 32C has a trace impedance Z. Assuming the PCB 10 has a tolerance of +/–15%, the values X, Y, and Z are expected to be within +/–15% of one another.

Studies have shown that the variation of measured trace impedances on a single layer is lower than when trace impedances on distinct layers are measured. Thus, for example, where the trace impedances of traces 32A and 32B are compared, the difference is typically smaller than when the trace impedances of traces 32A and 32C are compared. Empirically, same layer variation between trace impedances is measured at approximately five percent, according to one embodiment. Thus, if trace 32A has a trace impedance of 50 ohms, the trace impedance of trace 32B is expected to be within five percent of 50 ohms, or between 47.5 ohms and 52.5 ohms.

Empirical measurements of traces between two different signal layers (where one of the layers is a microstrip, or outside layer) is noticeably different than same layer measurements, according to one embodiment. In this case, a variation of between seven and ten percent is observed. Thus, if trace 32A has a trace impedance of 50 ohms, the trace impedance of trace 32C may be as much as ten percent greater than or less than 50 ohms, or between 45 and 55 ohms.

Figure 3:
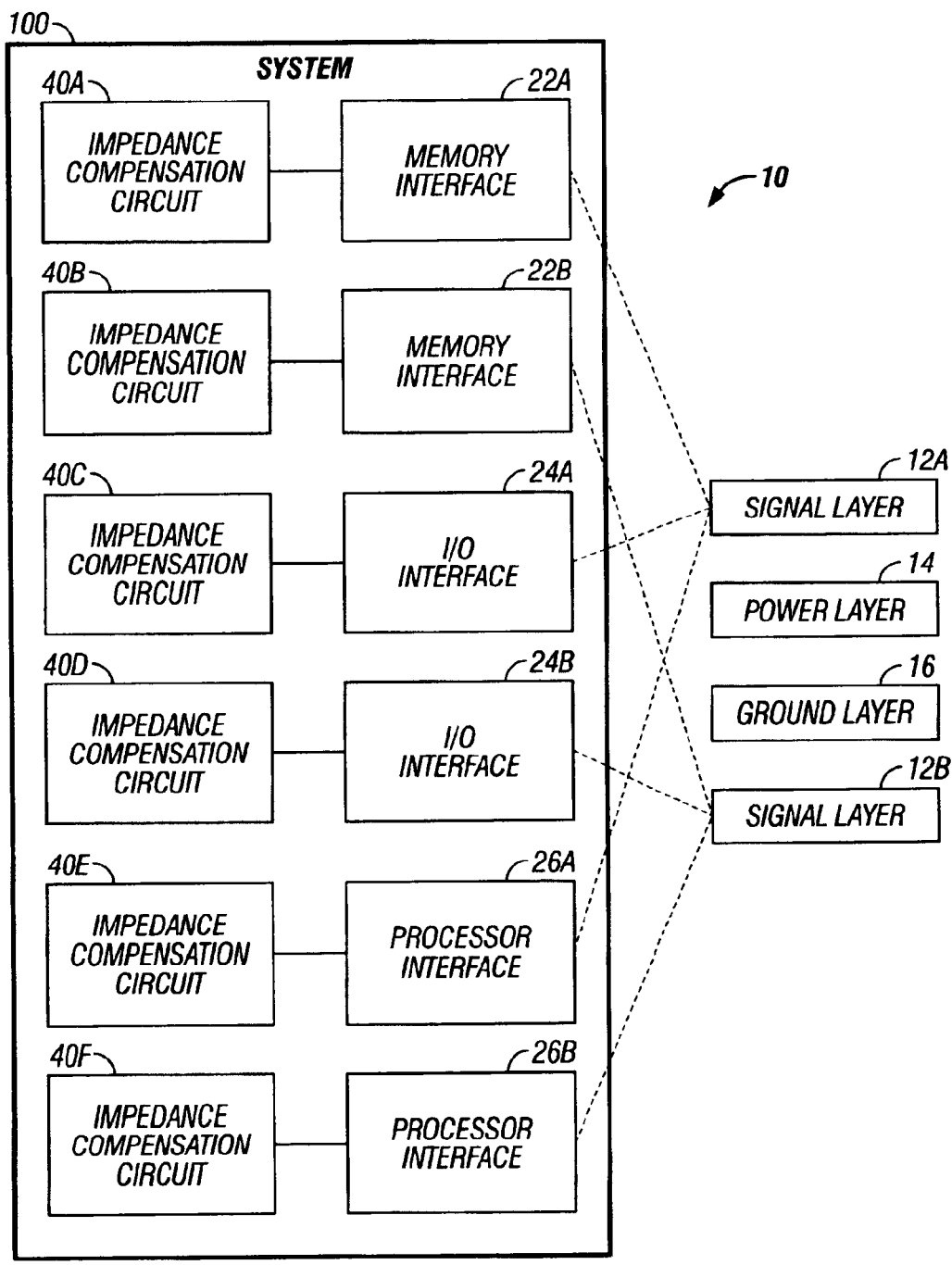
FIG. 3 is a block diagram of a system employing impedance compensation according to the described embodiments of the invention.

When the percentage difference between a first trace impedance on a first layer and a second trace impedance on a second layer is lower than the manufacturer-specified tolerance, an improved, or tighter, multi-layer impedance tolerance is available. Likewise, when the percentage difference between a first trace impedance and a second trace impedance on a single layer is lower than a manufacturer-specified tolerance, an improved, or tighter, single layer impedance tolerance is available. The improved single-layer and multi-layer tolerances are exploited by the system 100, as shown in FIG. 3.

As in FIGS. 1 and 2, the four-layer PCB 10 features signal layers 12A and 12B, as well as power 14 and ground 16. The system 100 also includes memory interfaces 22A and 22B, I/O interfaces 24A and 24B, and processor interfaces 26A and 26B. A separate impedance compensation circuit is dedicated to each signal layer of the PCB 10 for each interface supported. As in FIG. 1, each interface is separated into two distinct blocks, one for each signal layer occupied by the interface.

Thus, memory interface 22A, which occupies signal layer 12A, is connected to its own impedance compensation circuit 40A. Memory interface 22B, residing on signal layer 12B, is connected to impedance compensation circuit 40B. Likewise, I/O Interface 24A (on signal layer 12A) is connected to impedance compensation circuit 40C while I/O interface 24B (on signal layer 12B) is connected to impedance compensation circuit 40D. Processor interface 26A (on signal layer 12A) is connected to impedance compensation circuit 40E while processor interface 26B (on signal layer 12B) is connected to its own impedance compensation circuit 40F.

By using impedance compensation circuitry for each signal layer of the PCB, interface signals laid out on a specific layer can estimate a lower variation of trace impedance in the design. Even though the board is still manufactured to meet a certain impedance requirement plus tolerance, the board design can depend on the same layer improved impedance tolerance to influence the design. Issues such as how far apart the traces can be, the length and width of the traces used by the interface, the PCB board size, the number of ICs to occupy the PCB board space, and so on, are easier to make when a smaller tolerance in the board impedance is expected. Despite the presence of more impedance compensation circuits, improved board routing space is found, in some embodiments.

The principle of associating an impedance compensation circuit with each portion of an interface that occupies a distinct PCB layer can be extended to other multiple-layer PCB board designs. For example, where the interface occupies three layers, three impedance compensation circuits can be used, one dedicated to each portion of the interface on each layer. This can extend to any number of signal layers.

In other embodiments, the AC timings recovery can be improved, in which the speed of signals used in the system 100 increases. In addition to or instead of improving the board routing space, the design of the system can be modified to accept signals of higher frequencies. Higher frequency signals typically are more sensitive to impedance changes. The tighter tolerance of trace impedances (or narrower range of tolerances) in the system 100, as compared to the system 50, can permit the use of higher frequency signals.

While the invention has been described with respect to a limited number of embodiments, those skilled in the art will appreciate numerous modifications and variations therefrom. It is intended that the appended claims cover all such modifications and variations as fall within the true spirit and scope of the invention.

What is claimed is:

1. A system comprising:
   a first interface occupying a first layer of a printed circuit board, the first interface having a first interface impedance, wherein first signal traces having first trace impedances are coupled to the first interface;
   a second interface occupying a second layer of the printed circuit board, the second interface having a second interface impedance, wherein second signal traces having second trace impedances are coupled to the second interface; and
   a first impedance compensation circuit coupled to the first interface, wherein the first impedance compensation circuit is adjusted until the first interface impedance is substantially similar to the first trace impedance; wherein the adjustment by the first impedance compensation circuit is not based upon either the second interface impedance or the second trace impedance, nor is the adjustment based upon the impedance of another circuit on the second layer.

2. The system of claim 1, further comprising:
   a second impedance compensation circuit residing on the second layer of the printed circuit board and coupled to the second interface, wherein the second impedance compensation circuit is adjusted until the second interface impedance is substantially similar to the second trace impedance.

3. The system of claim 2, further comprising:
   a predetermined number of integrated circuits occupying the first layer of the printed circuit board, wherein the predetermined number is based on a manufacturer-specified tolerance of the printed circuit board;
   wherein an additional integrated circuit is added to the first layer of the printed circuit board after the first impedance compensation circuit is adjusted due to an improved single-layer impedance tolerance of the first layer of the printed circuit board.

4. The system of claim 3, the first traces having a predetermined width, wherein the predetermined width is decreased due to the improved single-layer impedance tolerance.

5. The system of claim 3, further comprising:
   third traces on the first layer of the printed circuit board, the third traces being disposed adjacent to the first traces being a predetermined distance from the third traces, wherein the predetermined distance is decreased due to the improved single-layer impedance tolerance.

6. The system of claim 3, further comprising:
   a single operating at a predetermined speed, wherein the signal traverses one or more of the first traces;
   wherein the predetermined speed is increased due to the improved single-layer impedance tolerance.

7. The system of claim 3, wherein the printed circuit board has a predetermined size, wherein the predetermined size is decreased due to the improved single-layer impedance tolerance.

8. The system of claim 2, further comprising:
   a predetermined number of integrated circuits occupying the first layer of the printed circuit board, wherein the predetermined number is based on a manufacturer-specified tolerance of the printed circuit board;
   wherein an additional integrated circuit is added to the printed circuit board after the first impedance compensation circuit is adjusted due to an improved multi-layer impedance tolerance of the printed circuit board.

9. The system of claim 8, the first traces having a predetermined width, wherein the predetermined width is decreased due to the improved multi-layer impedance tolerance.

10. The system of claim 8, further comprising:
    third traces on the first layer of the printed circuit board, the third traces being disposed adjacent to the first traces, the first traces being a predetermined distance from the third traces, wherein the predetermined distance is decreased due to the improved multi-layer impedance tolerance.

11. The system of claim 8, further comprising:
    a signal operating at a predetermined speed, wherein the signal traverses one or more of the first signal traces;
    wherein the predetermined speed is increased due to the improved multi-layer impedance tolerance.

12. The system of claim 8, wherein the printed circuit board has a predetermined size, wherein the predetermined size is decreased due to the improved multi-layer impedance tolerance.

13. A method comprising:
    identifying an interface of a system, the interface comprising
    a first interface occupying a first layer of a printed circuit board, the first interface having a first interface impedance, wherein first signal traces having first trace impedances are coupled to the first interface;
    a second interface occupying a second layer of said printed circuit board, the second interface having a second interface impedance, wherein second signal traces having second trace impedances are coupled to the second interface; and
    coupling a first impedance compensation circuit with the first interface portion,
    wherein the first impedance compensation circuit is adjusted until the first interface impedance is substantially similar to the first trace impedance;
    wherein the adjustment by the first impedance compensation circuit is not based upon either the second interface impedance or the second trace impedance, nor is the adjustment based upon the impedance of another circuit on the second layer.

14. Said method of claim 13, further comprising:
    associating a second impedance compensation circuit with the second interface wherein the second impedance compensation circuit controls the impedance of signals pertaining to the second interface.

15. The method of claim 14, further comprising:

specifying a number of integrated circuits to populate the first layer of the printed circuit board, the number being based on manufacturer-specified tolerance of the printed circuit board;

identifying an improved multi-layer impedance tolerance relative to a manufacturer-specified tolerance; and increasing a number of integrated circuits on the printed circuit board.

16. The method of claim 14, further comprising:

specifying a number of integrated circuits to populate the first layer of the printed circuit board, the number being based on manufacturer-specified tolerance of the printed circuit board;

identifying an improved signal-layer impedance tolerance relative to a manufacturer-specified tolerance; and increasing a number of integrated circuits on the printed circuit board.

17. The method of claim 14, further comprising:

specifying a width for one or more traces on the first layer of the printed circuit board;

identifying an improved multi-layer impedance tolerance relative to a manufacturer-specified tolerance; and decreasing the width for one or more traces on the printed circuit board.

18. The method of claim 14, further comprising:

specifying a width for one or more traces on the first layer of the printed circuit board;

identifying an improved signal-layer impedance tolerance relative to a manufacturer-specified tolerance; and decreasing the width for one or more traces on the printed circuit board.

19. The method of claim 14, further comprising:

specifying a width for one or more traces on the first layer of the printed circuit board;

identifying an improved multi-layer impedance tolerance relative to a manufacturer-specified tolerance; and decreasing the width between traces of two or more traces on the printed circuit board.

20. The method of claim 14, further comprising:

specifying a width between traces for one or more traces on the first layer of the printed circuit board;

identifying an improved single-layer impedance tolerance relative to a manufacturer-specified tolerance; and decreasing the width between traces of two or more traces on the printed circuit board.

21. The method of claim 14, further comprising:

specifying a speed of one or more signals to operate within the system;

identifying an improved multi-layer impedance tolerance relative to a manufacturer-specified tolerance; and increasing the speed of one or more signals on the printed circuit board.

22. The method of claim 14, further comprising:

specifying a speed of one or more signals to operate within the system;

identifying an improved single-layer impedance tolerance relative to a manufacturer-specified tolerance; and increasing the speed of one or more signals on the printed circuit board.

23. The method of claim 14, further comprising:

specifying a size of the printed circuit board, the size being based on a manufacturer-specified tolerance of the printed circuit board and a number of integrated circuits comprising the interface;

identifying an improved multi-layer impedance tolerance relative to a manufacturer-specified tolerance; and decreasing the size of the printed circuit board.

24. The method of claim 14, further comprising:

specifying a size of the printed circuit board, the size being based on a manufacturer-specified tolerance of the printed circuit board and a number of integrated circuits comprising the interface;

identifying an improved multi-layer impedance tolerance relative to a manufacturer-specified tolerance; and decreasing the size of the printed circuit board.

25. The method of claim 14, further comprising:

specifying one or more interconnect lengths between traces on the printed circuit board;

identifying an improved multi-layer impedance tolerance relative to a manufacturer-specified tolerance; and extending the interconnect lengths between traces on the printed circuit board.

26. The method of claim 14, further comprising:

specifying one or more interconnect lengths between traces on the printed circuit board;

identifying an improved single-layer impedance tolerance relative to a manufacturer-specified tolerance; and extending the interconnect lengths between traces on the printed circuit board.

* * * * *